United States Patent
Kakuyama et al.

(10) Patent No.: US 12,201,023 B2
(45) Date of Patent: Jan. 14, 2025

(54) THERMOELECTRIC-CONVERSION MATERIAL ELEMENT AND OPTICAL SENSOR CONTAINING THE SAME

(71) Applicant: Sumitomo Electric Industries, Ltd., Osaka (JP)

(72) Inventors: Kyohei Kakuyama, Osaka (JP); Kotaro Hirose, Osaka (JP); Masahiro Adachi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 18/279,599

(22) PCT Filed: Nov. 16, 2021

(86) PCT No.: PCT/JP2021/042037
§ 371 (c)(1),
(2) Date: Aug. 31, 2023

(87) PCT Pub. No.: WO2022/195957
PCT Pub. Date: Sep. 22, 2022

(65) Prior Publication Data
US 2024/0147860 A1    May 2, 2024

(30) Foreign Application Priority Data

Mar. 18, 2021  (JP) .................. 2021-044964

(51) Int. Cl.
*H10N 10/851*    (2023.01)
*G01J 1/02*    (2006.01)
(Continued)

(52) U.S. Cl.
CPC ........ *H10N 10/8556* (2023.02); *G01J 1/0204* (2013.01); *G01J 5/046* (2013.01);
(Continued)

(58) Field of Classification Search
CPC ...... H10N 10/8556; G01J 1/0204; G01J 5/12; G01J 5/046; G01J 5/10; G01J 2005/0077
See application file for complete search history.

(56) References Cited

U.S. PATENT DOCUMENTS

2008/0271772 A1    11/2008 Leonov et al.
2011/0155202 A1    6/2011 Arnold et al.
(Continued)

FOREIGN PATENT DOCUMENTS

JP    H09-092892 A    4/1997
JP    2884679 B2    4/1999
(Continued)

*Primary Examiner* — Jennifer D Bennett
*Assistant Examiner* — Erin R Garber
(74) *Attorney, Agent, or Firm* — XSENSUS LLP (57) ABSTRACT

An optical sensor includes a support and a thermoelectric-conversion material section including first material layers, second material layers, and a third material layer. Each of the first material layers may have a first region including a first end portion and a second region including a second end portion. Each of the second material layers may have a third region including a third end portion and a fourth region including a fourth end portion. The first region and the second region are electrically connected to the third region and the fourth region, respectively, such that the plurality of first material layers and the plurality of second material layers are alternately connected in series to each other. The third material layer is disposed between the first region and the third region.

11 Claims, 6 Drawing Sheets

(51) Int. Cl.
  *G01J 5/04*   (2006.01)
  *G01J 5/12*   (2006.01)
  *G01J 5/08*   (2022.01)
  *H10N 10/17*   (2023.01)

(52) U.S. Cl.
  CPC .............. *G01J 5/12* (2013.01); *G01J 5/0853* (2013.01); *H10N 10/17* (2023.02)

(56) References Cited

U.S. PATENT DOCUMENTS

| | | | | |
|---|---|---|---|---|
| 2015/0380625 | A1* | 12/2015 | Freer | C25D 9/02 |
| | | | | 264/105 |
| 2019/0252462 | A1* | 8/2019 | Spaziani | H10N 19/00 |
| 2020/0403136 | A1* | 12/2020 | Adachi | H10N 10/857 |
| 2021/0167270 | A1* | 6/2021 | Adachi | H10N 10/81 |
| 2022/0384703 | A1* | 12/2022 | Ghoshal | H10N 10/853 |

FOREIGN PATENT DOCUMENTS

| | | | | |
|---|---|---|---|---|
| JP | 2009-210289 A | 9/2009 | | |
| JP | 2018-537848 A | 12/2018 | | |
| WO | 2017/068527 A1 | 4/2017 | | |
| WO | WO-2019171915 A1 * | 9/2019 | ............. | H01L 35/26 |
| WO | WO-2020049852 A1 * | 3/2020 | ............. | B22F 9/002 |
| WO | 2021/002221 A1 | 1/2021 | | |

* cited by examiner

THERMOELECTRIC-CONVERSION MATERIAL ELEMENT AND OPTICAL SENSOR CONTAINING THE SAME

CROSS-REFERENCE TO RELATED APPLICATIONS

The present application is based on PCT filing PCT/JP2021/042037, filed Nov. 16, 2021, which claims priority to Japanese Patent Application No. 2021-044964, filed on Mar. 18, 2021, the entire contents of each are incorporated herein by reference.

TECHNICAL FIELD

The present disclosure relates to an optical sensor.

BACKGROUND ART

There is known a thermopile in which two types of materials forming a thermocouple are alternately joined in series and pad electrodes for wire bonding made of a material different from thermocouple materials are connected to the thermocouple materials so as to overlap the thermocouple materials (see, for example, PTL 1). According to the PTL 1, an intermediate layer made of a conductive material different from the materials of the thermocouple and the pad electrodes for wire bonding is interposed between the thermocouple materials and the pad electrodes for wire bonding.

CITATION LIST

Patent Literature

PTL 1: Japanese Unexamined Patent Application Publication No. H09-92892

SUMMARY OF INVENTION

An optical sensor according to the present disclosure includes a support; a thermoelectric-conversion material section disposed on a first main surface of the support and including a plurality of first material layers that each have an elongated shape, are each made of SiGe having a first conductivity type, and are each configured to convert thermal energy into electric energy, a plurality of second material layers that each have an elongated shape, are each made of SiGe having a second conductivity type different from the first conductivity type, and are each configured to convert thermal energy into electric energy, and a third material layer containing a metal; a heat sink disposed on a second main surface of the support; a light absorbing film disposed in such a manner as to form a temperature difference in a longitudinal direction of each of the first material layers when viewed in a thickness direction of the support and configured to convert light received by the light absorbing film into thermal energy; and a first electrode and a second electrode disposed in such a manner as to be isolated from the first electrode. Each of the first material layers is disposed in such a manner as to be in contact with the first main surface of the support, and has a first region including a first end portion and a second region including a second end portion opposite to the first end portion in the longitudinal direction. Each of the second material layers has a third region including a third end portion and a fourth region including a fourth end portion opposite to the third end portion in a longitudinal direction. The first region and the second region are electrically connected to the third region and the fourth region, respectively, such that the plurality of first material layers and the plurality of second material layers are alternately connected in series to each other. The third material layer is disposed between the first region and the third region in such a manner as to be in contact with the first region and the third region and is disposed between the second region and the fourth region in such a manner as to be in contact with the second region and the fourth region. The first region of a frontmost one of the first material layers connected in series is electrically connected to the first electrode, and the third region of a rearmost one of the second material layers connected in series is electrically connected to the second electrode.

DESCRIPTION OF EMBODIMENTS

Problems to be Solved by Present Disclosure

In an optical sensor such as a thermopile-type infrared sensor, reduction in a noise is required from a viewpoint of improvement in sensitivity of the sensor. It is difficult for the technique disclosed in PTL 1 to meet such a demand.

Therefore, an object of the present disclosure is to provide an optical sensor in which the noise can be reduced.

Advantageous Effects of Present Disclosure

According to the optical sensor, noise can be reduced.

Description of Embodiments of Present Disclosure

First, embodiments according to the present disclosure will be listed and described. An optical sensor according to the present disclosure includes a support; a thermoelectric-conversion material section disposed on a first main surface of the support and including a plurality of first material layers that each have an elongated shape (strip shape), are each made of SiGe having a first conductivity type, and are each configured to convert thermal energy into electric energy, a plurality of second material layers that each have an elongated shape (strip shape), are each made of SiGe having a second conductivity type different from the first conductivity type, and are each configured to convert thermal energy into electric energy, and a third material layer containing a metal; a heat sink disposed on a second main surface of the support; a light absorbing film disposed in such a manner as to form a temperature difference in a longitudinal direction of each of the first material layers when viewed in a thickness direction of the support and configured to convert light received by the light absorbing film into thermal energy; and a first electrode and a second electrode disposed in such a manner as to be isolated from the first electrode. Each of the first material layers is disposed in such a manner as to be in contact with the first main surface of the support, and has a first region including a first end portion and a second region including a second end portion opposite to the first end portion in the longitudinal direction. Each of the second material layers has a third region including a third end portion and a fourth region including a fourth end portion opposite to the third end portion in a longitudinal direction. The first region and the second region are electrically connected to the third region and the fourth region, respectively, such that the plurality of first material layers and the plurality of second material layers are alternately connected in series to each other. The third material layer is disposed between the first region and the third region in such a manner as to be in contact with the first region and the third region and is disposed between the second region and the fourth region in such a manner as to be in contact with the second region and the fourth region. The first region of a frontmost one of the first material layers connected in series is electrically connected to the first electrode, and the third region of a rearmost one of the second material layers connected in series is electrically connected to the second electrode.

A thermopile-type optical sensor using a thermoelectric conversion material that converts a temperature difference (thermal energy) into electric energy, such as an infrared sensor, may include a light receiving section such as a light absorbing film that converts optical energy into thermal energy, and a thermoelectric-conversion material section (thermopile) that converts a temperature difference into electric energy. In the thermoelectric-conversion material section, a thermocouple which a p-type thermoelectric-conversion material section and an n-type thermoelectric-conversion material section are connected to each other to form is used. A plurality of p-type thermoelectric-conversion material sections and a plurality of n-type thermoelectric-conversion material sections are alternately connected to each other in series to increase an output. A resistance in the optical sensor is expressed by the following equation shown in Math. 1.

$$R=(R_p+R_n)\times N+2\rho_c\times N \qquad \text{[Math. 1]}$$

R denotes a resistance, Rp denotes a resistance per p-type thermoelectric-conversion material section, Rn denotes a resistance per n-type thermoelectric-conversion material section, N denotes the number of pairs, and ρc denotes a contact resistance, that is, a resistance at portions where the p-type thermoelectric-conversion material sections and the n-type thermoelectric-conversion material sections are electrically connected to each other. As can be understood from this equation, if contact resistance ρc can be reduced, the resistance in the optical sensor can be reduced. The noise in the optical sensor is expressed by the following equation shown in Math. 2.

$$V_n=(4k\times T\times R\times \Delta f)^{1/2} \qquad \text{[Math. 2]}$$

Vn represents a Johnson noise (V), k represents a Boltzmann constant (J/K), T represents a temperature (K), R represents a resistance (Ω), and Δf represents a bandwidth (Hz=1/s). As can be understood from this equation, the Johnson noise depends on the resistance, and if the resistance can be reduced, the noise in the optical sensor can be reduced.

The present inventors have made intensive studies to reduce a resistance at portions where first material layers and second material layers which are thermoelectric conversion materials are in contact with each other. Then, it was found that when the second material layers are formed after the first material layers are formed, native oxide films formed on surface layers of the first material layers inhibit carrier transport and increase resistance. Therefore, the present inventors have focused on a viewpoint that the increase in resistance due to the oxide films is suppressed to improve conductivity, and have arrived at the configuration of the present disclosure.

The optical sensor according to the present disclosure further includes a third material layer containing a metal. The third material layer is disposed between the first region and the third region in such a manner as to be in contact with the first region and the third region, and is disposed between the second region and the fourth region in such a manner as to be in contact with the second region and the fourth region. This allows reduction in the resistance at the portions where the first material layers and the second material layers are electrically connected to each other. Therefore, the noise in the optical sensor can be reduced.

In the optical sensor, the metal may be a transition metal. The SiGe may have at least one of a nanocrystal structure or an amorphous structure. Such a metal, and SiGe that forms the first material layers and the second material layers are used to more reliably reduce the noise in the optical sensor.

In the optical sensor, the SiGe may be a polycrystal. Such polycrystalline SiGe is also suitably used in the optical sensor of the present disclosure. A crystallization rate of the polycrystal in the present disclosure is 99% or more.

In the optical sensor, a melting point of the metal may be 1455° C. or higher. Such a metal is thermally stable and is suitable as a material included in the optical sensor.

In the optical sensor, the metal may be any one of nickel (Ni), tungsten (W), molybdenum (Mo), titanium (Ti), gold (Au), palladium (Pd), germanium (Ge), hafnium (Hf), and aluminum (Al), or an alloy including any combination of Ni, W, Mo, Ti, Au, Pd, Ge, Hf, and Al. By using such elements as the metal, the resistance at the portions where the first material layers and the second material layers are electrically connected to each other can be more reliably reduced. Therefore, the noise can be reduced more reliably.

In the optical sensor, the metal may be any one of Ni, W, Mo, and Ti, or an alloy including any combination of Ni, W, Mo, and Ti. This allows the noise to be further reduced.

In the optical sensor, the third material layer may include an oxide film containing 10 at % or more of the metal. This allows the resistance at the portions where the first material layers and the second material layers are electrically connected to each other to be more reliably reduced. Therefore, the noise in the optical sensor can be reduced.

In the optical sensor, a thickness of the third material layer may be 3 nm to 200 nm. This allows suppression of a decrease in an electromotive force in the thermoelectric-conversion material section while reducing the resistance at the portions where the first material layers and the second material layers are electrically connected to each other.

DETAILS OF EMBODIMENTS OF PRESENT DISCLOSURE

Next, an embodiment of the optical sensor according to the present disclosure will be described with reference to the drawings. In the following drawings, the same or corresponding portions are denoted by the same reference numerals, and description thereof will be omitted.

First Embodiment

Figure 1:
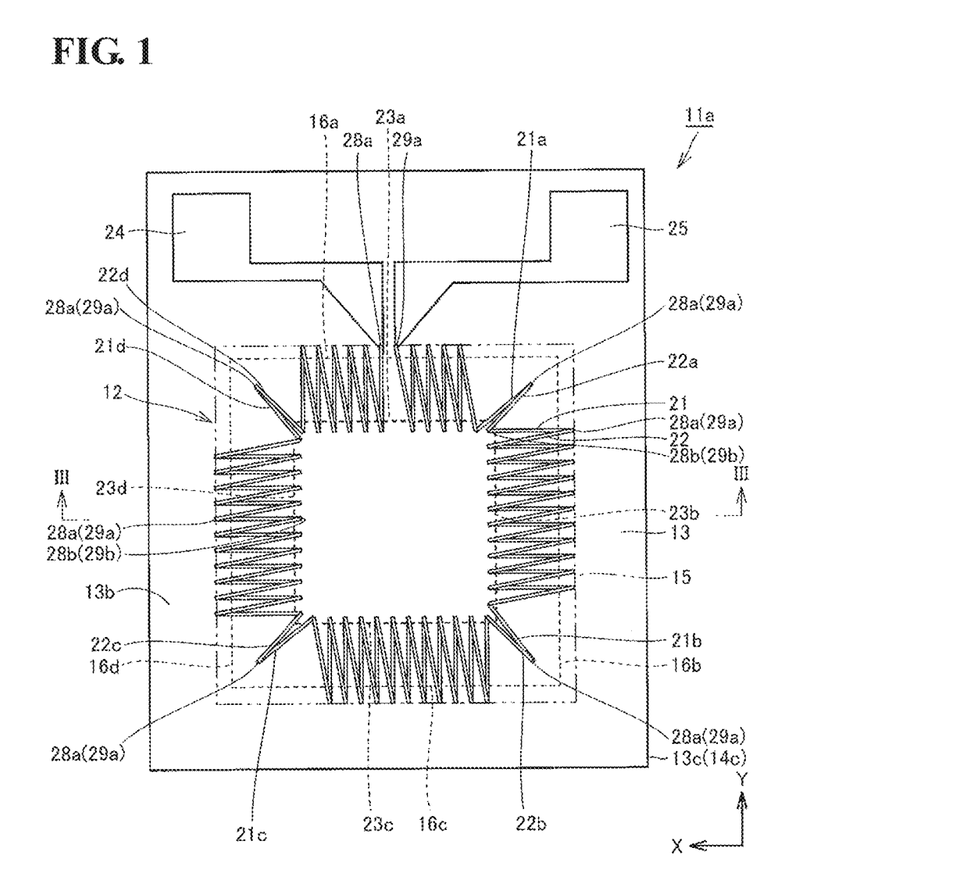
FIG. 1 is a schematic plan view of an appearance of an optical sensor according to a first embodiment.
Figure 2:
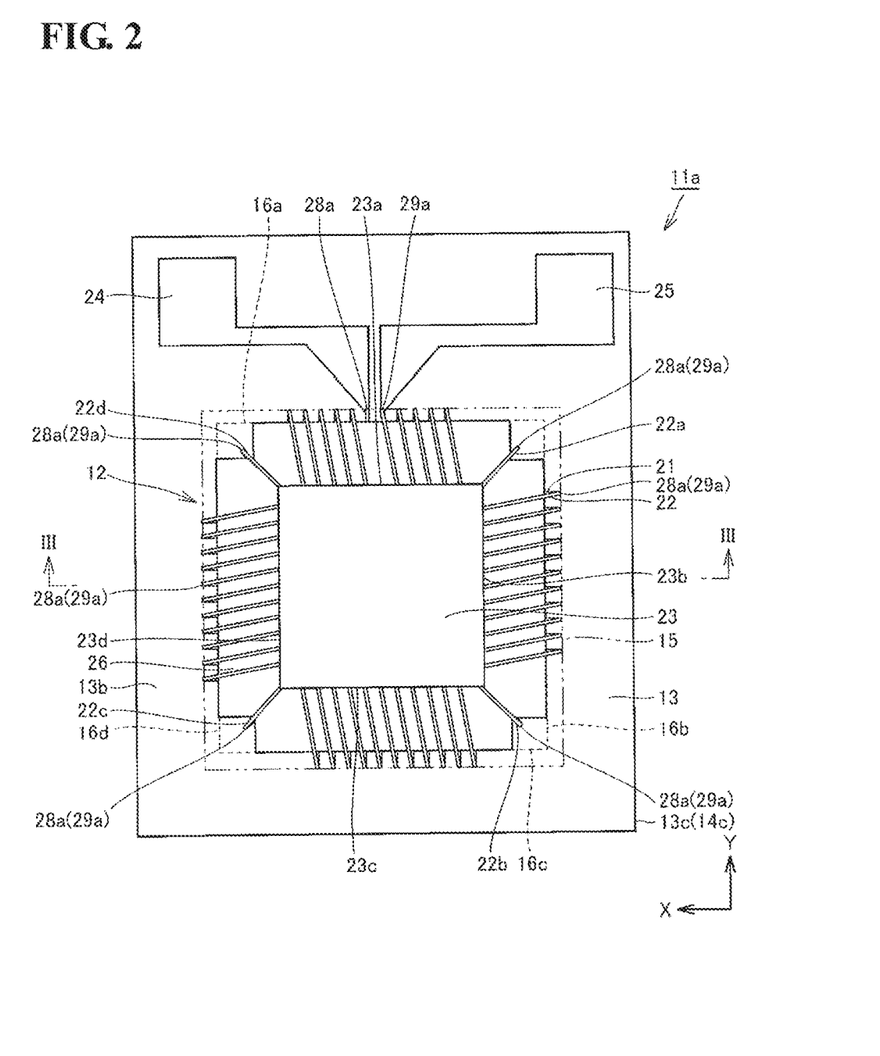
FIG. 2 is a schematic plan view of an appearance of the optical sensor according to the first embodiment.
Figure 3:
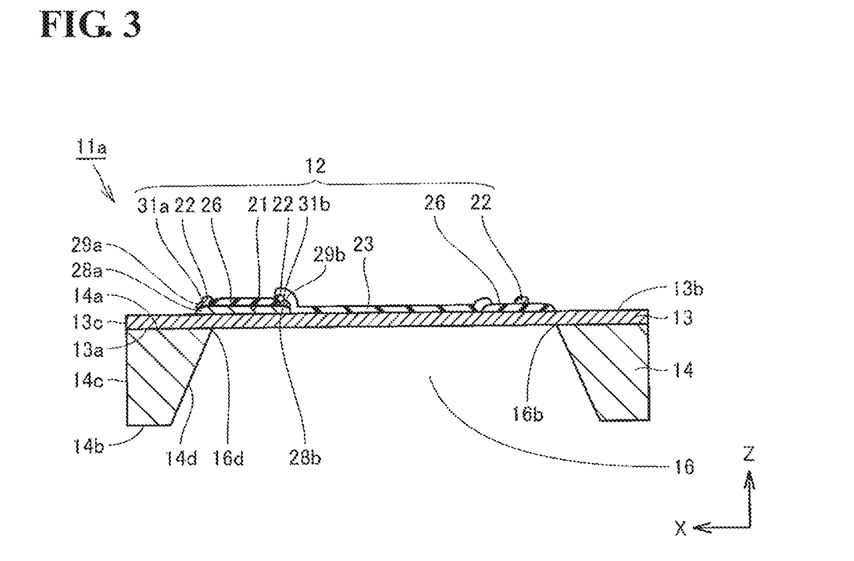
FIG. 3 is a schematic cross-sectional view showing a cross section taken along line in FIGS. 1 and 2.
Figure 4:
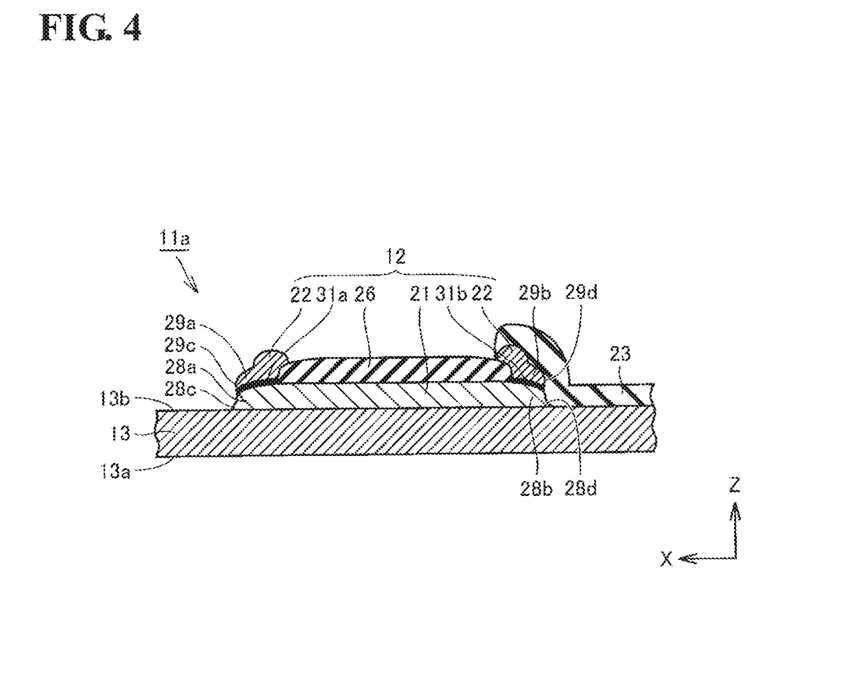
FIG. 4 is a schematic cross-sectional view showing a portion of the optical sensor according to the first embodiment.
Figure 5:
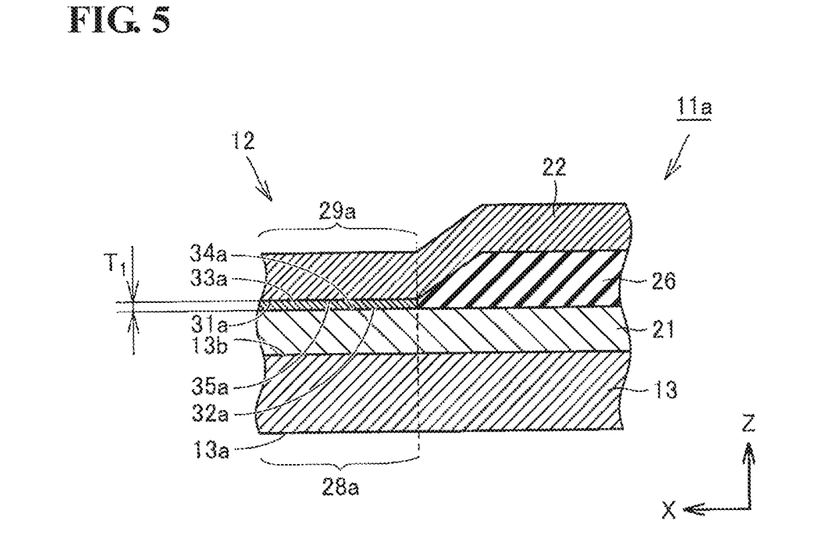
FIG. 5 is an enlarged schematic cross-sectional view of the portion of the optical sensor shown in FIG. 4.

An optical sensor according to a first embodiment of the present disclosure will be described. FIG. 1 and FIG. 2 are schematic plan views of appearances of the optical sensor according to the first embodiment. For ease of understanding, an infrared absorbing film and an insulating film, which will be described later, are not shown in FIG. 1. In FIG. 1, an outer edge where the infrared absorbing film is to be disposed is indicated by a dashed line. FIG. 3 is a schematic cross-sectional view taken along line III-III in FIGS. 1 and 2. FIG. 4 is a schematic cross-sectional view showing a portion of the optical sensor according to the first embodiment. FIG. 4 is an enlarged schematic cross-sectional view of a portion including a first region, a second region, a third region, and a fourth region, which will be described later. FIG. 5 is an enlarged schematic cross-sectional view of the portion of the optical sensor shown in FIG. 4.

Referring to FIGS. 1, 2, 3, 4 and 5, an optical sensor 11a is, for example, an infrared sensor. Optical sensor 11 a includes a support 13, a thermoelectric-conversion material section 12 disposed on a first main surface 13b of support 13, a heat sink 14, an infrared absorbing film 23 as a light absorbing film, a first electrode 24, and a second electrode 25. Thermoelectric-conversion material section 12 includes a plurality of first material layers 21 including first material layers 21a, 21b, 21c, and 21d, and a plurality of second material layers 22 including second material layers 22a, 22b, 22c, and 22d. Optical sensor 11 a detects a potential difference generated between first electrode 24 and second electrode 25 to detect an infrared ray irradiated to optical sensor 11 a. When the entire optical sensor 11a has a plate-like shape a thickness direction thereof is represented by a Z direction.

Support 13 has a thin film shape and has a rectangular shape when viewed in the thickness direction (Z direction). Support 13 supports thermoelectric-conversion material section 12 including the plurality of first material layers 21 and the plurality of second material layers 22, infrared absorbing film 23, first electrode 24, and second electrode 25. Support 13 is formed of, for example, a $SiO_2/SiN/SiO_2$ film. That is, support 13 has a configuration in which $SiO_2$, SiN, and $SiO_2$ are stacked.

An outer edge 14c which is an outer edge of the entire heat sink 14 and an outer edge 13c of support 13 extend contiguously in the Z direction. Heat sink 14 includes a first surface 14a and a second surface 14b which are spaced apart from each other in a thickness direction of optical sensor 11a. Heat sink 14 is disposed on a second main surface 13a of support 13. Specifically, heat sink 14 is disposed such that first surface 14a of heat sink 14 and second main surface 13a of support 13 are in contact with each other. Second surface 14b of heat sink 14 is exposed. In the present embodiment, heat sink 14 has a rectangular loop shape. Heat sink 14 is represented by two trapezoidal shapes in the cross-section shown in FIG. 3. Heat sink 14 is sufficiently thicker than support 13. For example, heat sink 14 has a thickness of 10 times or more the thickness of support 13. Heat sink 14 is a so-called substrate in the present embodiment. Heat sink 14 is made of, for example, Si.

A recess 16 which is concave in the thickness direction is formed in optical sensor 11 a. In a region corresponding to recess 16 when viewed from a side of second surface 14b, support 13, specifically, second main surface 13a of support 13 is exposed. An inner peripheral surface 14d of heat sink 14 surrounding recess 16 has a so-called tapered shape in which an opening is wider at a position closer to second surface 14b. Recess 16 is formed by, for example, anisotropic wet etching of a flat plate-like substrate. Such recess 16 is formed to suppress heat escape from infrared absorbing film 23 to heat sink 14. Therefore, it is possible to further increase a temperature difference in longitudinal directions of first material layer 21 and second material layer 22 which will be described later.

In FIG. 1, inner edges 16a, 16b, 16c, and 16d of heat sink 14, which are boundaries between heat sink 14 and support 13, are indicated by dashed lines in FIG. 1. As shown in FIG. 1, in the present embodiment, inner edges 16a, 16b, 16c, and 16d of heat sink 14 have a square shape when viewed in a thickness direction of support 13.

First material layer 21 is made of SiGe having an n-type which is a first conductivity type. That is, First material layer 21 is made of an n-type thermoelectric conversion material, and is made of a compound semiconductor containing Si (silicon) and Ge as constituent elements.

First material layer 21 has an elongated shape. First material layer 21 has a first region 28a including a first end portion 28c, and a second region 28b including a second end portion 28d opposite to first end portion 28c in a longitudinal direction. A direction in which a line connecting first region 28a and second region 28b extends is the longitudinal direction of first material layer 21 having the elongated shape. First material layer 21 converts a temperature difference between first region 28a and second region 28b into electric energy. First material layer 21 is disposed on first main surface 13b of support 13. First material layer 21 is disposed in such a manner as to be in contact with first main surface 13b of support 13. First material layer 21 is disposed such that first region 28a is located closer to inner edges 16a, 16b, 16c, and 16d of heat sink 14 and second region 28b is located closer to outer edges 23a, 23b, 23c, and 23d of infrared absorbing film 23 in the thickness direction of support 13.

Second material layer 22 is made of SiGe having a p-type which is a conductivity type different from the first conductivity type. That is, second material layer 22 is made of a p-type thermoelectric conversion material, and is made of a compound semiconductor containing Si and Ge as constituent elements.

Second material layer 22 has an elongated shape. Second material layer 22 has a third region 29a including a third end portion 29c, and a fourth region 29b including a fourth end portion 29d opposite to third end portion 29c in a longitudinal direction. A direction in which a line connecting third region 29a and fourth region 29b extends is the longitudinal direction of second material layer 22 having the elongated shape. Second material layer 22 converts a temperature difference between third region 29a and fourth region 29b into electric energy. In the present embodiment, second material layer 22 is disposed on a portion of an insulating film 26 described later that is disposed in such a manner as to be in contact with support 13 and on a portion of first material layer 21. When viewed in the thickness direction of support 13, second material layer 22 is disposed such that third region 29a is located closer to inner edges 16a, 16b, 16c, and 16d of heat sink 14 and fourth region 29b is located closer to outer edges 23a, 23b, 23c, and 23d of infrared absorbing film 23.

The plurality of first material layers 21 and the plurality of second material layers 22 are disposed above support 13 so as to be accommodated in an area 15 having a rectangular shape indicated by a two-dot chain line in FIG. 1. Thermoelectric-conversion material section 12 converts the temperature difference (thermal energy) into electric energy by using the plurality of first material layers 21 and the plurality of second material layers 22. Thermoelectric-conversion material section 12 includes insulating film 26. For example, $SiO_2$ is selected as a material of insulating film 26. An arrangement of the plurality of first material layers 21 and the plurality of second material layers 22 will be described in detail later.

Infrared absorbing film 23 is disposed on first main surface 13b of support 13, on a portion of first material layer 21, on a portion of second material layer 22, and on a portion of insulating film 26. Infrared absorbing film 23 is disposed in such a manner as to form the temperature difference in the longitudinal direction of first material layer 21, that is, between first region 28a and second region 28b. Specifically, infrared absorbing film 23 is disposed in such a manner as to expose first region 28a of first material layer 21 and third region 29a of second material layer 22 and to cover second region 28b of First material layer 21 and fourth region 29b of second material layer 22. In the present embodiment, infrared absorbing film 23 is disposed in such a manner as to form the temperature difference in the longitudinal direction of second material layer 22, that is, between third region 29a and fourth region 29b. Infrared absorbing film 23 is disposed in a region surrounded by inner edges 16a, 16b, 16c, and 16d of heat sink 14 in the thickness direction of support 13. In the present embodiment, infrared absorbing film 23 having outer edges 23a, 23b, 23c, 23d has a square shape when viewed in the thickness direction of support 13. Infrared absorbing film 23 is disposed in such a manner that a center of the square shape formed by outer edges 23a, 23b, 23c, and 23d of infrared absorbing film 23 and a center of the square shape formed by inner edges 16a, 16b, 16c, and 16d of heat sink 14 overlap each other when viewed in the thickness direction of support 13. Infrared absorbing film 23 converts an infrared ray into heat. Carbon (C) is selected as a material of infrared absorbing film 23, for example.

Next, an arrangement of thermoelectric-conversion material section 12 and infrared absorbing film 23 will be described. Specifically, insulating film 26 is disposed on first material layers 21 in portions where first material layers 21 are disposed, and is disposed on first main surface 13b of support 13 in portions where first material layers 21 are not disposed. Insulating film 26 is disposed so as not to cover first region 28a and second region 28b of first material layer 21. Second material layers 22 are disposed on a portion of first main surface 13b of support 13, on a portion of insulating film 26, and on a portion of first material layer 21. Second material layer 22 is disposed in such a manner that first region 28a of first material layer 21 and third region 29a of second material layer 22 are electrically connected via a third material layer 31a, and second region 28b of first material layer 21 and fourth region 29b of second material layer 22 are electrically connected via a third material layer 31b. In the present embodiment, third region 29a is disposed on first region 28a and fourth region 29b is disposed on second region 28b.

Infrared absorbing film 23 is disposed on a portion of first main surface 13b of support 13, on a portion of first material layer 21, on a portion of insulating film 26, and on a portion of second material layer 22. Infrared absorbing film 23 is disposed in such a manner as to expose first region 28a of first material layer 21 and third region 29a of second material layer 22. Infrared absorbing film 23 is disposed in such a manner as to cover second region 28b of first material layer 21 and fourth region 29b of second material layer 22. That is, each of connection portions at which second region 28b and fourth region 29b are connected to each other overlaps infrared absorbing film 23 when viewed in the thickness direction of support 13. First region 28a of first material layer 21 and third region 29a of second material layer 22 are not covered with infrared absorbing film 23. That is, first material layer 21 and second material layers 22 is thermally connected to infrared absorbing film 23 in such a manner as to form the temperature difference in the longitudinal directions of first material layer 21 and second material layer 22. First material layer 21 and second material layers 22 is disposed in such a manner that heat generated by infrared absorbing film 23 is transferred to second region 28b of first material layer 21 and fourth region 29b of second material layer 22, respectively. In this manner, the temperature difference is formed in the longitudinal directions of first material layer 21 and second material layer 22. This makes it possible to obtain optical sensor 11a in which the temperature difference formed by infrared absorbing film 23 and heat sink 14 is efficiently utilized.

Next, the arrangement of the plurality of first material layers 21 and the plurality of second material layers 22 will be described. The plurality of first material layers 21 are disposed so as to be spaced apart from each other. Except for first material layers 21a, 21b, 21c, and 21d, each of the plurality of first material layers 21 is disposed in such a manner that the longitudinal direction thereof is parallel to the X direction or the Y direction. Except for first material layers 21a, 21b, 21c, and 21d, each of the plurality of first material layers 21 is disposed in such a manner as to extend in a direction from each side of area 15 having a square shape toward an opposite side of area 15 (in such a manner that the longitudinal direction is parallel to the direction). First material layers 21 and second material layers 22 are alternately connected to each other electrically, except for first region 28a connected to first electrode 24 and third region 29a connected to second electrode 25. Specifically, first region 28a of first material layer 21 is electrically connected to third region 29a of one of second material layers 22 which are adjacent to first material layer 21 via third material layer 31a. Second region 28b of first material layer 21 is electrically connected to fourth region 29b of the other of second material layers 22 which are adjacent to first material layers 21 via third material layer 31b. In the plurality of first material layers 21 and the plurality of second material layers 22, except for first region 28a and third region 29a which are connected to first electrode 24 and second electrode 25, respectively, second region 28b and fourth region 29b are electrically connected to each other, and first region 28a and third region 29a are electrically connected to each other. That is, first material layer 21 is paired with one of second material layers 22, and first material layers 21 and second material layers 22 which are adjacent to each other are alternately connected in series to each other electrically in regions including end portions thereof.

A polarity of a voltage generated in first region 28a including first end portion 28c located at first end of first material layer 21 and a polarity of a voltage generated in third region 29a including third end portion 29c located at a first end of second material layer 22 are opposite to each other with respect to a direction of a temperature gradient generated when optical sensor 11 a is irradiated with light. In this case, the plurality of first material layers 21 and the plurality of second material layers 22 are always connected alternately. A frontmost one of first material layers 21 among first material layers 21 and second material layers 22 that are alternately connected in series is electrically connected to first electrode 24 in first region 28a. A rearmost one of second material layers 22 among first material layers 21 and second material layers 22 that are alternately connected in series is electrically connected to second electrode 25 in third region 29a. First electrode 24 and second electrode 25 are disposed outside area 15 on first main surface 13b of support 13. First electrode 24 and second electrode 25 are disposed so as to be spaced apart from each other. First electrode 24 and second electrode 25 are, for example, pad electrodes. Materials used for first electrode 24 and second electrode 25 includes, for example, gold (Au), titanium (Ti), platinum (Pt) and the like.

Thermoelectric-conversion material section 12 includes third material layer 31a containing a metal. Third material layer 31a is disposed between first region 28a and third region 29a in such a manner as to be in contact with first region 28a and third region 29a. In the present embodiment, third material layer 31a is disposed between first region 28a and third region 29a in the Z direction. In addition, thermoelectric-conversion material section 12 includes third material layer 31b containing a metal. Third material layer 31b is disposed between second region 28b and fourth region 29b in such a manner as to be in contact with second region 28b and fourth region 29b. In the present embodiment, third material layer 31b is disposed between second region 28b and fourth region 29b in the Z direction. The metal contained in each of third material layers 31a and 31b is Ni in the present embodiment. Furthermore, third material layers 31a and 31b include an oxide film containing 10 at % or more of Ni. In the present embodiment, third material layers 31a and 31b include an oxide film containing 10 at % or more of Ni.

A thickness $T_1$ of third material layer 31a is 3 nm to 200 nm (see FIG. 5). Thickness $T_1$ of third material layer 31a is represented by a thickness $T_1$ which is a length between a first surface 32a and a second surface 33a of third material layer 31a in the Z direction which is the thickness direction. In the thickness direction, first surface 32a of third material layer 31a is in contact with a first surface 34a of first material layer 21 closer to second material layers 22 in the thickness direction. In the thickness direction, second surface 33a of third material layer 31a is in contact with a first surface 35a of second material layer 22 closer to first material layers 21 in the thickness direction. Since a thickness of third material layer 31b is equal to the thickness of third material layer 31a, the description thereof will be omitted.

Hereinafter, a method of manufacturing optical sensor 11 a according to the first embodiment will be briefly described. First, a flat plate-like substrate is prepared, and support 13 is formed on a first main surface of the substrate in a thickness direction thereof. At this time, the substrate is in contact with second main surface 13a of support 13. Next, first material layers 21 are formed on first main surface 13b of support 13. Specifically, first material layers 21 are formed as follows. First, a lift-off resist is applied in a layer on first main surface 13b of support 13. Next, a positive-type resist is applied in a layer on the lift-off resist. Thereafter, the positive resist is exposed by photolithography and dissolved in a developing solution. Next, a semiconductor material is deposited to form a pattern, and the resist is removed from support 13 (lift-off). In this manner, first material layers 21 is formed.

After forming first material layers 21, support 13 is immersed in a buffered hydrogen fluoride (BHF) solution having a concentration of 10 mass % for 1 minute, and then subjected to a water washing treatment. After the water washing treatment, a native oxide film having a thickness of about 10 nm to 20 nm is formed on first material layer 21. Next, after a pattern for Ni as an intermediate metal layer is formed, Ni is deposited to form the intermediate metal layer. Next, insulating film 26 made of $SiO_2$ is formed, and a pattern for second material layers 22 is formed to form second material layers 22 by vapor deposition. Since the formation of each layer such as the formation of second material layers 22 is performed in the same manner as the formation of first material layers 21, the description thereof will be omitted.

After first material layers 21, the intermediate metal layer, and second material layers 22 are formed, activation treatment is performed by heating at about 550° C. After the immersion in BHF, Ni contained in the intermediate metal layer as a metal diffuses into the native oxide film having a thickness of about 10 nm to 20 nm formed on first material layer 21 subjected to the water washing treatment. In this manner, third material layers 31a and 31b containing Ni are formed. That is, third material layer 31a disposed between first region 28a and third region 29a in such a manner as to be in contact with first region 28a and third region 29a, and third material layer 31b disposed between second region 28b and fourth region 29b in such a manner as to be in contact with second region 28b and fourth region 29b are formed in this manner.

Subsequently, recess 16 is formed in a central region of the substrate from a second main surface of the substrate located on a side of the substrate opposite to a side on which support 13 is located in the thickness direction. In this case, recess 16 is formed to be recessed from the second main surface of the substrate to second main surface 13a of support 13. In this manner, heat sink 14 formed of the substrate is formed to obtain optical sensor 11a. In this case, the intermediate metal layer may be disposed between first region 28a and first electrode 24.

Next, the operation of optical sensor 11a will be described. When optical sensor 11 a is irradiated with light such as an infrared ray, optical energy is converted into thermal energy by infrared absorbing film 23. In this case, infrared absorbing film 23 is formed in the region surrounded by inner edges 16a, 16b, 16c, and 16d of heat sink 14, and a portion where infrared absorbing film 23 is disposed is a high temperature side. On the other hand, since heat sink 14 is disposed outside inner edges 16a, 16b, 16c, and 16d, temperature does not rise outside. Here, when one of first material layers 21 is focused, second region 28b of the one of first material layers 21 has a high temperature, and first region 28a of the one of first material layers 21 has a low temperature. That is, a temperature difference is formed between regions including both end portions in the longitudinal direction of the one of first material layers 21. Due to this temperature difference, a potential difference is formed. In the same manner, second material layer 22 also has an elongated shape in the longitudinal direction. Therefore, a temperature difference is formed between regions including both end portions. Due to this temperature difference, a potential difference is formed. Since the plurality of first material layers 21 and the plurality of second material layers 22 are connected in series to each other in such a manner that their polarities are alternately reversed, a potential difference output from first electrode 24 and second electrode 25 is the sum of the potential differences generated by the temperature differences in the plurality of first material layers 21 and the plurality of second material layers 22. Optical sensor 11 a detects a current flowing due to the potential difference between first electrode 24 and second electrode 25 to detect light, in this case, infrared light.

Optical sensor 11a includes third material layers 31a and 31b configured as described above. Therefore, the resistance in optical sensor 11a can be reduced. Therefore, the noise in optical sensor 11a can be reduced.

Figure 6:
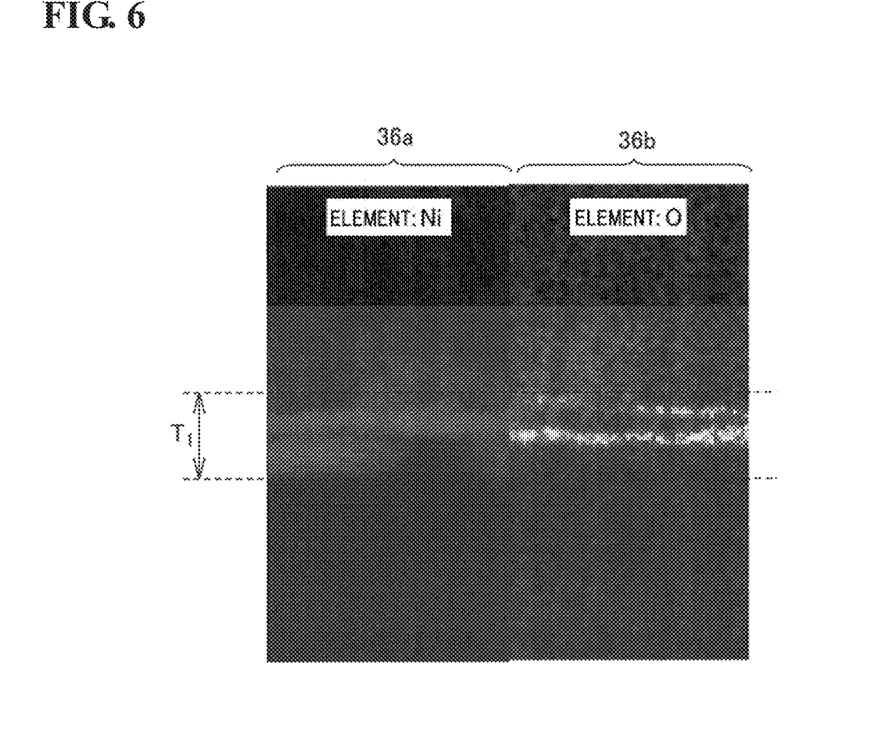
FIG. 6 is a diagram showing an EDX of a portion of a cross-section of the optical sensor shown in FIG. 5.
Figure 7:
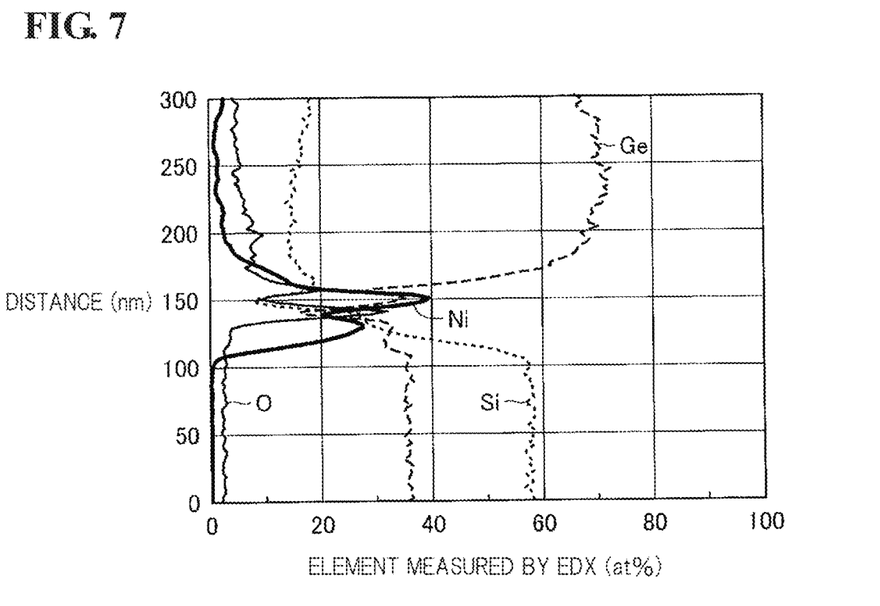
FIG. 7 is a graph showing a relationship between elements and a distance which are measured by the EDX in FIG. 6.

FIG. 6 is a diagram showing an EDX of a portion of a cross section of optical sensor 11a shown in FIG. 5. In FIG. 6, an area 36a on the left side shows a concentration of a Ni element, and an area 36b on the right side shows a concentration of an O (oxygen) element. FIG. 7 is a graph showing a relationship between elements and a distance which are measured by EDX in FIG. 6. In FIG. 7, a horizontal axis represents a concentration (at %) of the elements and a vertical axis represents the distance (nm). The distance is a distance from first main surface 13b in the Z direction. The measurement was performed in the following manner. JEM-2100F (manufactured by JEOL Ltd.) was used as an apparatus, and an acceleration voltage was set to 200 kV. A diameter of an electronic probe was set to 0.2 nm, and as EDX mapping conditions, the number of pixels was set to 256 pixels×256 pixels, a Dwell time was set to 0.5 ms/pixel, and the number of integrations was set to 15.

Referring to FIGS. 6 and 7, the concentration of Si decreases as the distance increases, and rapidly decreases at a distance of 150 nm. On the other hand, the concentration of Ge increases as the distance increases, and rapidly increases at a distance of 150 nm. Here, the concentration of Ni is 10 at % or more at a distance from 120 nm to 180 nm. The concentration of O also increases and reaches a peak at a distance from 120 nm to 180 nm. Referring to FIGS. 6 and 7, it can be seen that third material layer 31a containing the metal is disposed on first surface 34a of first material layer 21. Thickness $T_1$ of third material layer 31a in the present embodiment is 60 nm.

A resistance at the portions where first material layers 21 and second material layers 22 are electrically connected in optical sensor 11 a of the present disclosure is 99% lower than a contact resistance between first material layers and second material layers in an optical sensor that does not include third material layers 31a and 31b. In addition, a resistance in optical sensor 11 a of the present disclosure is 38% lower than a resistance in the optical sensor that does not include third material layers 31a and 31b. Furthermore, a Johnson noise in optical sensor 11 a of the present disclosure is 22% lower than a Johnson noise in the optical sensor that does not include third material layers 31a and 31b.

Figure 8:
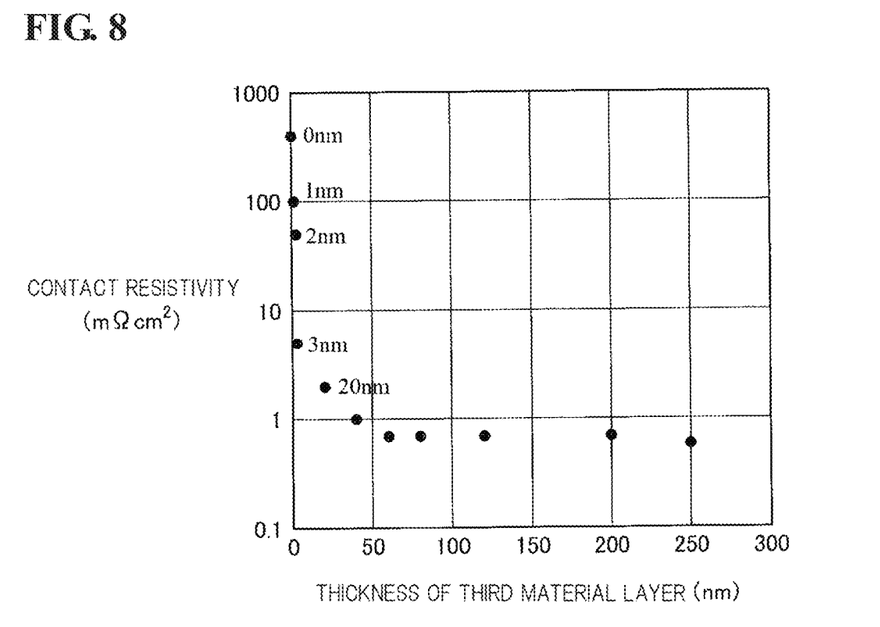
FIG. 8 is a graph showing a relationship between a contact resistivity at a portion where first material layers and second material layers are electrically connected to each other and a thickness of a third material layer.
Figure 9:
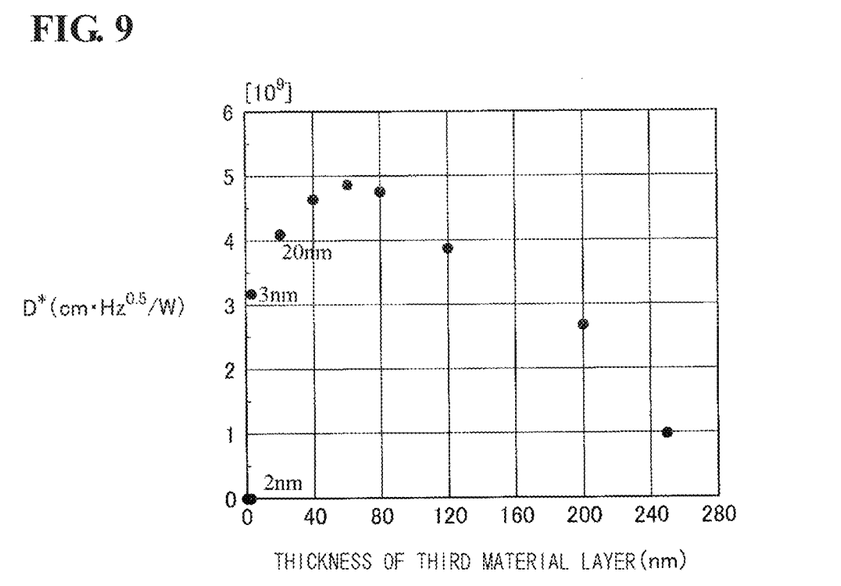
FIG. 9 is a graph showing a relationship between sensitivity D* of an optical sensor and the thickness of the third material layer.

FIG. 8 is a graph showing a relationship between a resistance at the portions where first material layers 21 and second material layers 22 are electrically connected to each other and a thickness of third material layers 31a and 31b. In FIG. 8, a horizontal axis represents a thickness (nm) of third material layers 31a and 31b, and a vertical axis represents a contact resistance (mΩ cm 2) at the portion where first material layers 21 and second material layers 22 are electrically connected to each other. FIG. 9 is a graph showing a relationship between sensitivity D* of the optical sensor and the thickness of third material layers 31a and 31b. In FIG. 9, a horizontal axis represents the thickness (nm) of third material layers 31a and 31b, and a vertical axis represents sensitivity D* (cm·Hz$^{0.5}$/W).

Referring to FIGS. 8 and 9, when thickness $T_1$ of third material layers 31a and 31b is 3 nm to 200 nm, it is possible to suppress a reduction in an electromotive force in thermoelectric-conversion material section 12 while reducing the resistance at the portions where first material layers 21 and second material layers 22 are electrically connected to each other. When thickness $T_1$ of third material layers 31a and 31b is 20 nm to 120 nm, the metal can be sufficiently diffused into the oxide film, and the resistance can be a more suitable value. Therefore, the sensitivity can be further improved. When thickness $T_1$ of third material layers 31a and 31b is 40 nm to 80 nm, the metal can be more sufficiently diffused into the oxide film, and the resistance can be an even more suitable value. Therefore, the sensitivity can be further improved.

Although the metal contained in third material layers 31a and 31b is Ni in the above-described embodiment, the metal is not limited thereto. The metal contained in third material layers 31a and 31b may be a transition metal. The SiGe may have at least one of a nanocrystal structure or an amorphous structure. Such a metal, and SiGe that forms first material layers 21 and second material layers 22 is used to more reliably reduce the noise in optical sensor 11 a. The SiGe, which is a constituent material of first material layers 21 and second material layers 22, may be formed as follows. For example, SiGe having an amorphous structure may be subjected to heat treatment at a temperature of, for example, about 500° C. to form a nanocrystal structure in a portion thereof. Also, the SiGe may have a nanocrystal structure or an amorphous structure. Here, the nanocrystal structure is a structure in which nano-sized crystal grains (nanocrystals) are partially included in SiGe. Inside the nanocrystal, atoms are regularly aligned. In addition, the SiGe may be polycrystal. Such a polycrystalline SiGe is also suitably used in the optical sensor of the present disclosure. A crystallization rate of the polycrystal in the present disclosure is 99% or more. The crystallization rate was measured in the following manner. HORIBA LabRam HR-PL was used as an apparatus. As measurement conditions, a laser wave length was set to 532 nm and a laser power was set to 2.5 mW. As an analysis condition, a peak around 400 cm$^{-1}$ was analyzed. In the analysis, a Gaussian function and a pseudo-Voigt function were fitted. The Gaussian function G (x) is expressed by the following equation shown in Math. 3.

$$G(x) = A_g \exp\left(-\frac{4\ln 2}{W_g^2}(x - x_g)^2\right) \quad \text{[Math. 3]}$$

The pseudo-Voigt function F (x) is expressed by the following equation shown in Math. 4.

$$F(x) = A_p \frac{m}{\pi}\left[\frac{W_f}{(x - x_f)^2 + W_f^2}\right] + A_p \frac{1 - m}{\sqrt{2\pi W_f}} \exp\left[-\frac{(x - x_f)^2}{2W_f^2}\right] \quad \text{[Math. 4]}$$

In the Gaussian function G (x): parameters $A_g$, $W_g$, and $x_g$, an initial value of $x_0$ was set to 400 cm$^{-1}$. In the pseudo-Voigt function F (x): parameters $A_F$, $W_f$, $x_f$, and m, an initial value of $x_0$ was set to 380 cm$^{-1}$, and m was set to 0.5. Each of parameters was optimized by the least squares method, and each of the pseudo-Voigt function and the Gaussian function was integrated to obtain an area. The crystallization rate was calculated by an equation of crystallization rate=area derived using the pseudo-Voigt function/(area derived using the pseudo-Voigt function+area derived using the Gaussian function), considering that the area derived using the Gaussian function corresponds to amorphous structure and the area derived using the pseudo-Voigt function corresponds to crystalline structure.

Also, the melting point of the metal included in third material layers 31a and 31b may be 1455° C. or higher. Such a metal is thermally stable and is suitable as a material included in optical sensor 11 a.

Figure 10:
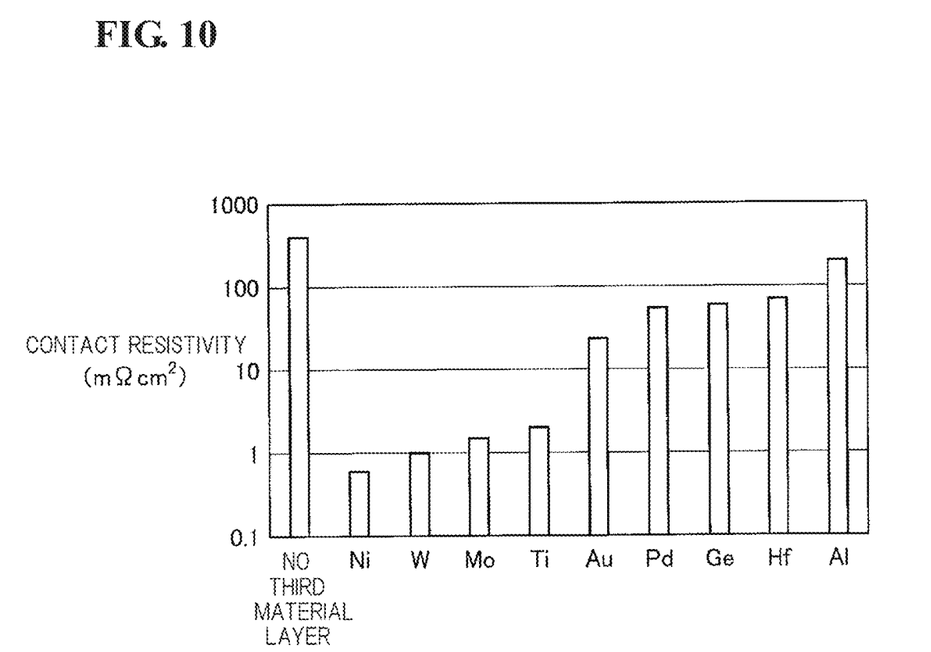
FIG. 10 is a graph showing a relationship between a contact resistivity at the portion where the first material layers and the second material layers are electrically connected to each other and various metals contained in the third material layer.

FIG. 10 is a graph showing a relationship between a contact resistivity at the portion where first material layers 21 and second material layers 22 are electrically connected to each other and various metals contained in the third material layer. In FIG. 10, a horizontal axis represents the various metals, and a vertical axis represents the contact resistivity (mΩ cm 2) at the portion where first material layers 21 and second material layers 22 are electrically connected to each other.

Referring to FIG. 10, when the third material layer is not included, the contact resistivity is 400 (mΩ cm 2). On the other hand, when the third material layer containing Ni as the metal is included, the contact resistivity is 0.6 (mΩ cm 2). When the third material layer containing W as the metal is included, the contact resistivity is 1.0 (mΩ cm 2). When the third material layer containing Mo as the metal is included, the contact resistivity is 1.5 (mΩ cm 2). When the third material layer containing Ti as the metal is included, the contact resistivity is 2.0 (mΩ cm 2). When the third material layer containing Au as the metal is included, the contact resistivity is 24 (mΩ cm 2). When the third material layer containing Pd, as the metal is included, the contact resistivity is 55 (mΩ cm 2). When the third material layer containing Ge as the metal, the contact resistivity is 60 (mΩ cm 2). When the third material layer containing Hf as the metal is included, the contact resistivity ratio is 70 (mΩ cm 2). When third material layer containing Al as the metal, the contact resistivity is 200 (mΩ cm 2).

As the metal included in third material layers 31a and 31b, it is preferable to select any one of Ni, W, Mo, Ti, Au, Pd, Ge, Hf, and Al, or an alloy including any combination of Ni, W, Mo, Ti, Au, Pd, Ge, Hf, and Al. Such elements can more reliably reduce the resistance at the portions where first material layers 21 and second material layers 22 are electrically connected to each other. Therefore, the noise can be reduced more reliably.

In addition, when any one of Ni, W, Mo, and Ti, or an alloy of any combination of Ni, W, Mo, and $T_1$ is selected as the metal included in third material layers 31a and 31b, the noise can be further reduced.

Other Embodiments

In the above-described embodiment, the first conductivity type is an n-type, and the n-type thermoelectric conversion material is used for the first material layers. The conductivity type different from the first conductivity type is a p-type, and the p-type thermoelectric conversion material is used for the second material layers. However, the present disclosure is not limited thereto. The first conductivity type may be a p-type, and the p-type thermoelectric conversion material may be used for the first material layers. The conductivity type different from the first conductivity type may be an n-type, and the n-type thermoelectric conversion material may be used for the second material layers.

In addition, with respect to the oxide film formed on first material layers 21 after the above-described water washing treatment, in consideration of an effect of energy filtering, it is preferable that the thickness of the oxide film is about 0.1 nm to 10 nm from a viewpoint of increasing a Seebeck coefficient.

Although the heat sink has a rectangular loop shape in the above embodiment, the present invention is not limited thereto. For example, the heat sink may have a configuration in which the heat sink is formed in a grid shape when viewed in the thickness direction of the support, and a plurality of rectangular supports may be disposed in respective regions corresponding to so-called windows of the grid-shaped heat sink. Specifically, for example, a configuration may be employed in which the plurality of rectangular supports, which are thin portions, are disposed at intervals, and the heat sink is disposed in a region between the supports. This also enables reduction in the noise. Such a configuration is employed, for example, when the optical sensor is used as an array sensor.

Furthermore, although the third region is disposed on the first region, and the fourth region is disposed on the second region in the above-described embodiment, the present disclosure is not limited thereto. The first region and the third region may be configured to be disposed adjacently to each other, and the second region and the fourth region may be configured to be disposed adjacently to each other, when viewed in the thickness direction of the support. That is, when viewed in the thickness direction of the support, the third material layer may be disposed between the first region and the third region that are disposed adjacently to each other in such a manner as to be in contact with each of the first region and the third region, and the third material layer may be disposed between the second region and the fourth region that are disposed adjacently to each other in such a manner as to be in contact with each of the second region and the fourth region. This also enables reduction in the noise.

It should be understood that the embodiments disclosed in the present disclosure are merely illustrative and non-restrictive in every respect. The scope of the present disclosure is defined by the claims rather than the description above, and is intended to include any modifications within the scope and meaning equivalent to the claims.

REFERENCE SIGNS LIST 11a optical sensor; 12 thermoelectric-conversion material section; 13 support;
13a, 13b main surface; 13c, 14c, 23a, 23b, 23c, 23d outer edge; 14 heat sink;
14a, 14b, 32a, 33a, 34a, 35a surface; 14d inner peripheral surface; 15, 36a, 36b area;
16 recess; 16a, 16b, 16c, 16d inner edge; 21, 21a, 21b, 21c, 21d first material layer;
22, 22a, 22b, 22c, 22d second material layer;
23 infrared absorbing film (light absorbing film); 24 first electrode; 25 second electrode;
26 insulating film; 28a first region; 28b second region; 28c first end portion;

28d second end portion; 29a third region; 29b fourth region; 29c third end portion;
29d fourth end portion; 31a, 31b third material layer;
$T_1$ thickness; D* sensitivity; X, Y, Z direction

The invention claimed is:

1. An optical sensor comprising:
a support;
a thermoelectric-conversion material section including a plurality of first material layers, a plurality of second material layers, and a third material layer, each of the plurality of first material layers having an elongated shape, being made of SiGe having a first conductivity type, and being configured to convert thermal energy into electric energy, each of the plurality of second material layers having an elongated shape, being made of SiGe having a second conductivity type different from the first conductivity type, and being configured to convert thermal energy into electric energy, the third material layer containing a metal, the thermoelectric-conversion material section being disposed on a first main surface of the support;
a heat sink disposed on a second main surface of the support;
a light absorbing film disposed in such a manner as to form a temperature difference in a longitudinal direction of each of the first material layers when viewed in a thickness direction of the support and configured to convert light received by the light absorbing film into thermal energy; and
a first electrode and a second electrode disposed in such a manner as to be isolated from the first electrode,
wherein each of the first material layers
is disposed in such a manner as to be in contact with the first main surface of the support, and
has a first region including a first end portion and a second region including a second end portion, the second end portion being opposite to the first end portion in the longitudinal direction,
wherein each of the second material layers has a third region including a third end portion and a fourth region including a fourth end portion, the fourth end portion being opposite to the third end portion in the longitudinal direction,
wherein the first region and the second region are electrically connected to the third region and the fourth region, respectively, such that the plurality of first material layers and the plurality of second material layers are alternately connected in series to each other,
wherein the third material layer is disposed between the first region and the third region in such a manner as to be in contact with the first region and the third region and is disposed between the second region and the fourth region in such a manner as to be in contact with the second region and the fourth region,
wherein the first region of a frontmost one of the first material layers connected in series is electrically connected to the first electrode, and the third region of a rearmost one of the second material layers connected in series is electrically connected to the second electrode, and
wherein when viewed in the thickness direction, the first region, the third region and third material layer partially overlap each other and the second region, the fourth region and the third material layer partially overlap each other.

2. The optical sensor according to claim 1, wherein the metal is a transition metal, and wherein the SiGe has at least one of a nanocrystal structure or an amorphous structure.

3. The optical sensor according to claim 1, wherein the SiGe is a polycrystal.

4. The optical sensor according to claim 1, wherein a melting point of the metal is 1455° C. or higher.

5. The optical sensor according to claim 1, wherein the metal is any one of Ni, W, Mo, Ti, Au, Pd, Ge, Hf, and Al or is an alloy of any combination of Ni, W, Mo, Ti, Au, Pd, Ge, Hf, and Al.

6. The optical sensor according to claim 5, wherein the metal is any one of Ni, W, Mo, and Ti or is an alloy of any combination of Ni, W, Mo, and Ti.

7. The optical sensor according to claim 1, wherein the third material layer includes an oxide film containing 10 atom % or more of the metal.

8. The optical sensor according to claim 1, wherein the third material layer has a thickness of 3 nm to 200 nm.

9. The optical sensor according to claim 1, wherein the first conductivity type is n-type, and the second conductivity type is p-type.

10. The optical sensor according to claim 1, wherein a first contact resistivity at the portion where the first region and the third region are electrically connected is 0.6 M$\Omega$cm$^2$ to 200 M$\Omega$cm$^2$ and a second contact resistivity at the portion where the second region and the fourth region are electrically connected is 0.6 M$\Omega$cm$^2$ to 200 M$\Omega$cm$^2$.

11. An optical sensor comprising:
a support;
a thermoelectric-conversion material section including a plurality of first material layers, a plurality of second material layers, and a third material layer, each of the plurality of first material layers having an elongated shape, being made of SiGe having a first conductivity type, and being configured to convert thermal energy into electric energy, each of the plurality of second material layers having an elongated shape, being made of SiGe having a second conductivity type different from the first conductivity type, and being configured to convert thermal energy into electric energy, the third material layer containing a metal, the thermoelectric-conversion material section being disposed on a first main surface of the support;
a heat sink disposed on a second main surface of the support;
a light absorbing film disposed in such a manner as to form a temperature difference in a longitudinal direction of each of the first material layers when viewed in a thickness direction of the support and configured to convert light received by the light absorbing film into thermal energy;
a first electrode and a second electrode disposed in such a manner as to be isolated from the first electrode,
wherein each of the first material layers is disposed in such a manner as to be in contact with the first main surface of the support, and has a first region including a first end portion and a second region including a second end portion, the second end portion being opposite to the first end portion in the longitudinal direction,
wherein each of the second material layers has a third region including a third end portion and a fourth region including a fourth end portion, the fourth end portion being opposite to the third end portion in the longitudinal direction,
wherein the first region and the second region are electrically connected to the third region and the fourth region, respectively, such that the plurality of first material layers and the plurality of second material layers are alternately connected in series to each other, wherein the third material layer is disposed between the first region and the third region in such a manner as to be in contact with the first region and the third region and is disposed, between the second region and the fourth region in such a manner as to be in contact with the second region and the fourth region, wherein the first region of a frontmost one of the first material layers connected in series is electrically connected to the first electrode, and the third region of a rearmost one of the second material layers connected in series is electrically connected to the second electrode, wherein the metal is any one of Ni, W, Mo, Ti, Au, Pd, Ge, Hf, and Al or is an alloy of any combination of Ni, W, Mo, Ti, Au, Pd, Ge, Hf, and Al, and wherein a first contact resistivity at the portion where the first region and the third region are electrically connected is 0.6 M$\Omega$cm$^2$ to 200 M$\Omega$cm$^2$ and a second contact resistivity at the portion where the second region and the fourth region are electrically connected is 0.6 M$\Omega$cm$^2$ to 200 M$\Omega$cm$^2$.

* * * * *